United States Patent
Tortora et al.

(10) Patent No.: US 12,373,282 B2
(45) Date of Patent: Jul. 29, 2025

(54) PROCESSING SYSTEM, RELATED INTEGRATED CIRCUIT AND METHOD

(71) Applicant: STMicroelectronics S.r.l., Agrate Brianza (IT)

(72) Inventors: Gianluca Tortora, Legnano (IT); Mario Barone, Lombardy (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 137 days.

(21) Appl. No.: 18/106,117

(22) Filed: Feb. 6, 2023

(65) Prior Publication Data

US 2023/0251926 A1    Aug. 10, 2023

(30) Foreign Application Priority Data

Feb. 7, 2022    (IT) .......................... 102022000002093

(51) Int. Cl.
  *G11C 29/42*    (2006.01)
  *G06F 11/10*    (2006.01)
(52) U.S. Cl.
  CPC .......... *G06F 11/1004* (2013.01); *G11C 29/42* (2013.01)
(58) Field of Classification Search
  CPC ........................... G06F 11/1004; G11C 29/42
  See application file for complete search history.

(56) References Cited

U.S. PATENT DOCUMENTS

| | | | | |
|---|---|---|---|---|
| 2002/0144103 A1* | 10/2002 | Kendall | ................. | G11C 16/20 713/1 |
| 2019/0227867 A1* | 7/2019 | Ellur | .................... | H03M 13/098 |
| 2020/0169459 A1* | 5/2020 | Colombo | .................. | H04L 9/40 |

FOREIGN PATENT DOCUMENTS

| | | | |
|---|---|---|---|
| EP | 3401183 A1 | 11/2018 | |
| EP | 3531289 A1 | 8/2019 | |
| EP | 3657345 A1 | 5/2020 | |

OTHER PUBLICATIONS

IT Search Report and Written Opinion for priority application, IT 102022000002093, report dated Sep. 9, 2022, 8 pgs.

\* cited by examiner

*Primary Examiner* — Mark D Featherstone
*Assistant Examiner* — Jeffrey Andrew Yang
(74) *Attorney, Agent, or Firm* — Crowe & Dunlevy LLC

(57) ABSTRACT

A processing system includes configuration registers and a non-volatile memory with memory slots storing configuration data bits and error detection bits. A hardware configuration circuit sequentially reads the data bits from the non-volatile memory for storage in respective configuration registers by: receiving bits from a current memory slot; selectively asserting an error signal in response to comparison of received error detection bits with calculated error detection bits; storing the received bits to temporary registers where the error signal deasserted and other otherwise asserting a further error signal where the error signal is asserted. Otherwise, predetermined configuration data is stored to the temporary registers. The content of the temporary registers is then sequentially stored to the configuration registers. A reset signal is generated in response to the further error signal to reset the configuration registers.

23 Claims, 11 Drawing Sheets

PROCESSING SYSTEM, RELATED INTEGRATED CIRCUIT AND METHOD

PRIORITY CLAIM

This application claims the priority benefit of Italian Application for Patent No. 102022000002093 filed on Feb. 7, 2022, the content of which is hereby incorporated by reference in its entirety to the maximum extent allowable by law.

TECHNICAL FIELD

Embodiments of the present disclosure relate to solutions for managing configuration data within a processing system in the form, for example, of an integrated circuit.

BACKGROUND

In many processing systems, the behavior of the processing system, in particular of one or more subcircuits thereof, may be varied based on configuration data.

For example, FIG. 1 shows a possible solution for reading such configuration data CD from a non-volatile memory 12, such as an Electrically Erasable Programmable Read-Only Memory (EEPROM) or one-time programmable (OTP) memory, and storing the configuration data CD to a plurality of registers 112 of a processing system 10 that is implemented, for example, in an integrated circuit 30.

Specifically, in the embodiment considered, the processing system 10 comprises a hardware configuration circuit 108 configured to read the configuration data CD from the non-volatile memory 12. For example, for this purpose, the hardware configuration circuit 108 may comprise a data read circuit 1080 configured to sequentially read a given number of bits of the configuration data CD from the non-volatile memory 12, and generate a signal DATA comprising the given number of bits read from the memory 12.

In the example considered, the hardware configuration circuit 108 comprises also a control circuit 1082 implemented, for example, via a finite state machine (FSM), configured to control the operation of the hardware configuration circuit 108. Substantially, the control circuit 1082 implements a state control circuit managing the operation of the hardware configuration circuit 108 and a dispatch circuit configured to forward the configuration data CD to the registers 112.

For example, in the example considered, the processing system 10 comprises a reset circuit 116 configured to generate a reset signal RST in response to given events, such as a power-on of the processing system 10. Accordingly, in response to the reset signal RST, the control circuit 1082 may generate one or more control signals CTRL in order to indicate that the data read circuit 1080 should sequentially read the configuration data CD from the non-volatile memory 12.

For example, in order to distribute the configuration data CD to the registers 112, for example a given number N of registers REG1, ..., REGN, each register REG1, ..., REGN may have associated a respective address and the control circuit 1082 may generate an address signal ADR used to indicate to which register the bits of the signal DATA should be stored. For example, for this purpose the processing system 10 may comprise an address decoder 124 configured to store the signal DATA to one of the registers REG1, ..., REGN as a function of the address signal ADR.

For example, the address decoder 124 of FIG. 1 is implemented with a de-multiplexer, configured to selectively forward the signal DATA to one of the registers REG1, ..., REGN as a function of the address signal ADR.

Conversely, in FIG. 2, the registers 112 are connected to the signal DATA via a bus, wherein the signal DATA is provided in parallel to all registers 112 and each register is configured to store the bits of the signal DATA when a respective write-enable signal WEN1, ..., WENN is asserted. Accordingly, in this case, the address decoder 124 may be configured to assert one of the write-enable signals WEN1, ..., WENN as a function of the address signal ADR. In this case, the control circuit 1082 preferably generates also a general write enable signal WEN, wherein the address decoder 124 is configured to assert one of the write-enable signal WEN1, ..., WENN as a function of the address signal ADR only when the write enable signal WEN is asserted by the control circuit 1082.

For example, such a solution is disclosed in United States Patent Application Publication No. 2020/0169459, which is incorporated herein by reference for this purpose. For example, in this document, the configuration data CD are stored in the form of configuration data frames, also identified as Device Configuration Format (DCF), wherein a first subset of bits indicates the address of a register 112, for example forming part of a more complex configuration data client, and a second subset of bits indicates the configuration data CD to be stored to the respective register 112. Accordingly, in this way, the control circuit 1082 may generate the address signal ADR based on the address included in the configuration data frame, thereby transferring the configuration data CD included in the configuration data frame to the respective registers 112. Typically, prior to transferring the configuration data CD to the registers 112, the registers 112 are reset in response to the reset signal RST.

Accordingly, one of more circuits 110 of the processing system 10 may use the configuration data CD stored to the registers 112. For example, such configuration data CD are often calibration data used to guarantee that the hardware behavior is uniform, thereby compensating possible production process tolerances. For example, this applies often to the calibration of analog components of the processing system, such as a temperature sensor, analog-to-digital converter, voltage reference, etc. For example, a voltage monitor threshold level of an analog comparator could be "trimmed" to the exact intended value by adjusting some levels with configuration/calibration data, which are written by the producer of the hardware of the processing systems. Additionally or alternatively, the configuration data CD may be used to selectively configure, for example activate or deactivate, given functions of the processing system 10.

For example, FIG. 3 shows a block diagram of an exemplary processing system 10, such as a micro-controller.

In the example considered, the processing system 10 comprises a microprocessor (MP) 102, usually the Central Processing Unit (CPU), programmed via software instructions. Usually, the software executed by the microprocessor 102 is stored in a non-volatile program memory (M) 104, such as a Flash memory or EEPROM. Thus, the memory 104 is configured to store the firmware of the processing unit 102, wherein the firmware includes the software instructions to be executed by the microprocessor 102. Generally, the non-volatile memory 104 could also correspond to the memory 12 and could be used to store also the configuration data CD. The microprocessor 102 usually has associated also a volatile memory (VM) 104$b$, such as a Random-Access-Memory (RAM). For example, the memory 104$b$ may be used to store temporary data. As shown in FIG. 3, usually the communication with the memories 104 and/or 104b is performed via one or more memory controllers (MC) 100. The memory controller(s) 100 may be integrated in the microprocessor 102 or connected to the microprocessor 102 via a communication channel, such as a system bus of the processing system 10. Similarly, the memories 104 and/or 104b may be integrated with the microprocessor 102 in a single integrated circuit, or the memories 104 and/or 104b may be in the form of a separate integrated circuit and connected to the microprocessor 102, for example via the traces of a printed circuit board.

In addition to or as an alternative to the microprocessor 102, the processing system 10 may comprise one or more (hardware) resources/peripherals 106, for example selected from the group of:

one or more communication interfaces IF, for example for exchanging data via the communication system 20, such as a Universal asynchronous receiver/transmitter (UART), Serial Peripheral Interface Bus (SPI), Inter-Integrated Circuit ($I^2C$), Controller Area Network (CAN) bus, and/or Ethernet interface; and/or one or more analog-to-digital converters AD and/or digital-to-analog converters DA; and/or one or more dedicated digital components DC, such as hardware timers and/or counters, or a cryptographic co-processor; and/or one or more analog components AC, such as comparators, sensors, such as a temperature sensor, etc.; and/or one or more mixed signal components MSC, such as a PWM (Pulse-Width Modulation) driver.

Generally, a dedicated digital component DC may also correspond to a field programmable gate array (FPGA) integrated in the processing system 10. For example, in this case, the memory 104 may also comprise the program data for such a FPGA.

For example, in case of a micro-controller the resources/peripherals 106 are connected to the microprocessor 102 via a suitable communication system, such as one or more system buses.

For example, in such a processing system 10, the configuration data CD stored to the registers 112 may be used to influence the behavior of one or more of the resources/peripherals 106 and/or the microprocessor 102 and/or the memory controller 100. For example, the configuration data CD may include calibration data for one or more sensors, configuration data indicating the timing of a PWM signal, security configuration data indicating whether the access to given memory areas is inhibited, etc.

In this respect, United States Patent Application Publication No. 2020/0169459 also discloses the possibility to: associate with each configuration data frame respective error detection and/or correction data ECC; and/or include in the configuration data CD itself one or more error detection data, such as parity bits, whereby the configuration data client 112 may comprise an error detection circuit configured to verify the bits stored to the respective register of the configuration data client 112.

Moreover, United States Patent Application Publication No. US 2019/0258493 A1, which is incorporated herein by reference for this purpose, discloses that signature data, such as a hash code, may be stored in the non-volatile memory 12 for all configuration data CD.

Thus, while the above cited documents disclose solutions for verifying the correctness of the configuration data CD at different levels, these solutions are complex and may not always be suitable for certain applications, for example in case of low-complexity and low-cost processing systems 10.

There is a need in the art to provide reduced-complexity solutions for managing the distribution of configuration data within a processing system.

SUMMARY

One or more embodiments relate to a processing system. Embodiments moreover concern a related integrated circuit, device and method.

As mentioned before, various embodiments of the present disclosure relate to solutions for managing the distribution of configuration data in a processing system, for example integrated in an integrated circuit. Specifically, in various embodiments, the processing system comprises a serial non-volatile memory comprising a given number K of memory slots, wherein each memory slot has a given number L of bits, wherein the L bits of a memory slot comprise a first number of configuration data and a second number of error detection bits calculated as a function of the respective first number of configuration data.

In various embodiments, the processing system comprises a given number N of configuration registers and one or more circuits configured to change operation as a function the bit values stored to the configuration registers. Specifically, each configuration register has associated a given univocal address and has P bits, wherein each configuration register is configured to reset its content to a respective reset value in response to a reset signal generated by a reset circuit, for example in response to a power-on of the processing system. Accordingly, the given number L of bits of the memory slots corresponds to a given multiple Q of the given number P of bits of the configuration registers, with $Q=L/P$ and $N=Q \times K$, wherein Q configuration registers are associated with each memory slot.

In various embodiments, the processing system comprises also a hardware configuration circuit comprising a given number of Q temporary registers, wherein each temporary register has P bits. Specifically, the hardware configuration circuit is configured to, in response to the reset signal and/or one or more other trigger signals signaling an event, sequentially read the data from the non-volatile memory and store the data read to the respective configuration registers. For this purpose, the hardware configuration circuit repeats a sequence of operations for each of the K memory slots of the non-volatile memory.

Specifically, in various embodiments, the hardware configuration circuit determines an index of a current memory slot of the non-volatile memory and receives the respective L bits of the current memory slot via a serial communication from the non-volatile memory. For example, for this purpose, the hardware configuration circuit may comprise a data-read circuit comprising a reception register having L bits, and a serial communication interface configured to receive the L bits of the current memory slot via a serial communication from the non-volatile memory, and assert a control signal after having received the respective L bits. For example, the serial communication interface may be configured to receive the L bits of the current memory slot by sending a read request to the non-volatile memory, the read request comprising data identifying the index of the current memory slot of the non-volatile memory. In various embodiments, the serial communication interface also generates a signal indicating the index of the current memory slot of the non-volatile memory.

Once having received the respective L bits of the current memory slot, the hardware configuration circuit calculates, for example using an error detection circuit, further error detection bits as a function of the received configuration data and selectively asserts an error signal by comparing the received error detection bits with the calculated error detection bits.

In various embodiments, the hardware configuration circuit is configured to verify whether the error signal is asserted and, in response to determining that the error signal is asserted, assert a further error signal. Accordingly, the further error signal indicates whether the data of at least one of the already read memory slots comprises an error. Specifically, in various embodiments, the hardware configuration circuit is configured to verify whether the further error signal is asserted and store the received L bits to the temporary registers when the further error signal is de-asserted. Conversely, when the further error signal is asserted, the hardware configuration circuit stores predetermined configuration data to the temporary registers. For example, for this purpose, the hardware configuration circuit may comprise a control circuit comprising a selection circuit configured to provide the received L bits or the predetermined configuration data to the temporary registers as a function of the further error signal. For example, the temporary registers may be configured to store the data provided by the selection circuit in response to the control signal generated by the serial communication interface.

In various embodiments, the hardware configuration circuit then sequentially stores the content of each of the Q temporary registers to respective Q configuration registers by providing the content of one of the temporary registers and generating via a counter an address signal having the address associated with a respective configuration register. For example, for this purpose, the hardware configuration circuit may comprise a sequential logic circuit implementing a state machine, wherein the state machine is configured to sequentially increase a count value for Q consecutive clock cycles in response to the control signal generated by the serial communication interface, wherein the address signal corresponds to the count value, or is determined by combining the bits of the count value and the bits of the signal indicating the index of the current memory slot.

Accordingly, in various embodiments, in case of an error in the configuration data of a given memory slot, the hardware configuration circuit provides for this memory slot and all following memory slots predetermined configuration data to the configuration register. Accordingly, in various embodiments, the hardware configuration circuit may be configured to, once having received the data of the K memory slots, verify whether the further error signal is asserted, and generate a further reset signal for resetting at least in part the content of the configuration registers, thereby also resetting the configuration registers having already been programmed with configuration data. For example, for this purpose, the state machine may be configured to determine whether all memory slots have been transferred to the configuration registers, for example as a function of the count value and optionally the signal indicating the index of the current memory slot of the non-volatile memory. Next, in response to determining that all memory slots have been transferred to the configuration registers, the state machine may assert the further reset signal as a function of the further error signal.

In various embodiments, the hardware configuration circuit, such as the selection circuit, is configured to store the error detection bits of the received L bits together with the predetermined configuration data to the temporary registers in response to determining that the further error signal is asserted, whereby the error detection bits received for the K memory slots are stored to predetermined bit positions of the configuration registers. Accordingly, in order to avoid that these error detection bits are reset via the further reset signal, the configuration registers may be configured to reset the content of the configuration registers in response to the reset signal, and reset the content of the configuration registers except for the predetermined bit positions in response to the further reset signal. For example, in this way, the error detection bits may still be read. For example, for this purpose, the processing system may comprise a communication interface, such as a debug interface, configured to transmit the content of one or more of the configuration registers to an external device.

Alternatively, the hardware configuration circuit, for example the data read circuit, may be configured to store the error detection bits of the received L bits to further registers, which are configured to be reset in response to the first reset signal, and maintain their content when the second reset signal is asserted. In this case, the bits of the configuration registers used to provide the error detection bits may be implemented with shadow registers, which are connected to the further registers used to store the error detection bits.

BRIEF DESCRIPTION OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
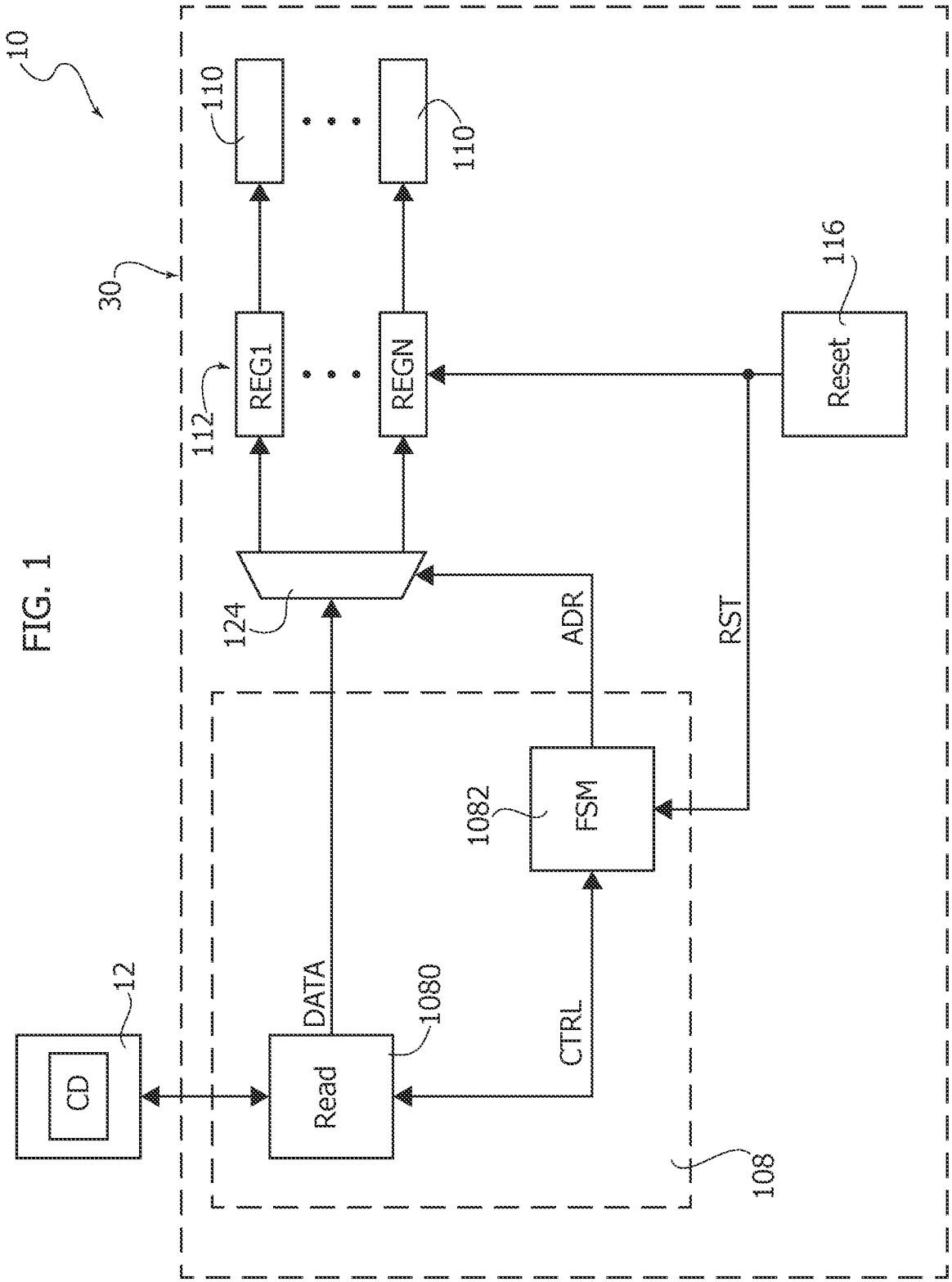
FIG. 1 shows a first example of a processing system configured to read configuration data from a non-volatile memory.
Figure 3:
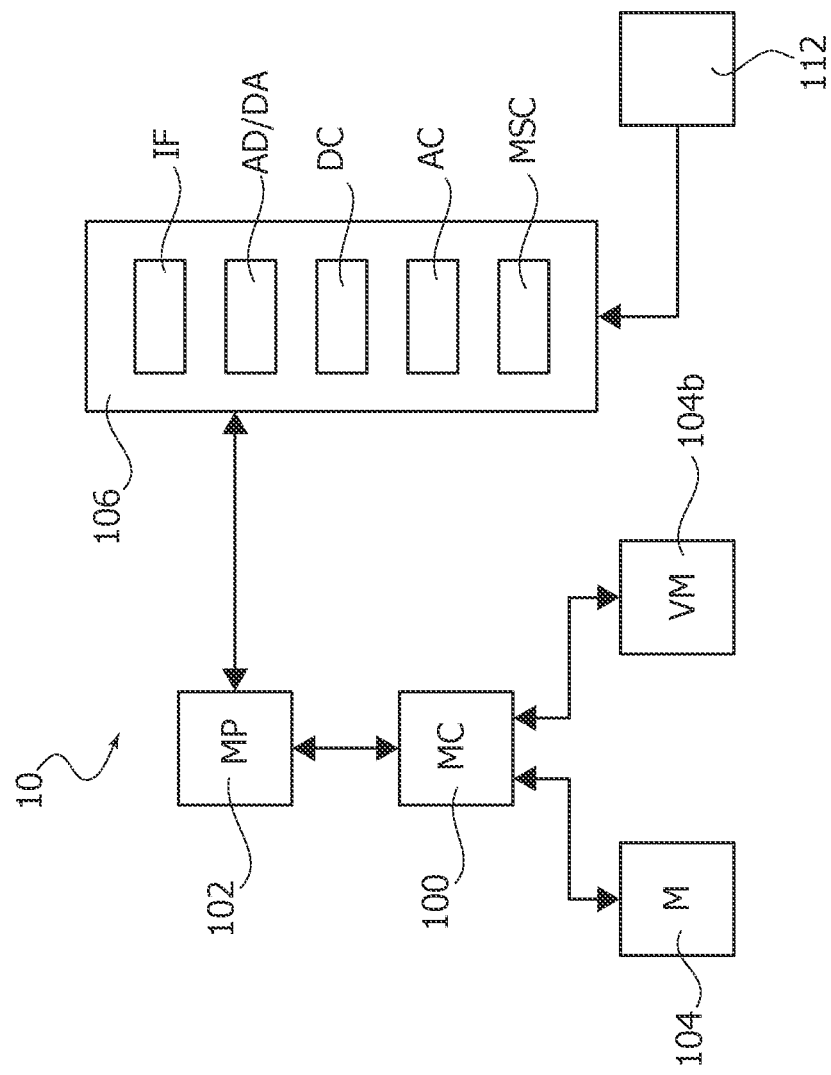
FIG. 3 shows an example of a processing system, such as a microcontroller.

In the following FIGS. 4 to 14, it will be noted that parts, elements or components which have already been described with reference to FIGS. 1 and 3 are denoted by the same references previously used in such Figures; the description of such previously described elements will not be repeated in the following in order not to overburden the present detailed description.

As mentioned before, various embodiments of the present disclosure relate to solutions for managing the distribution of configuration data within a processing system.

Figure 4:
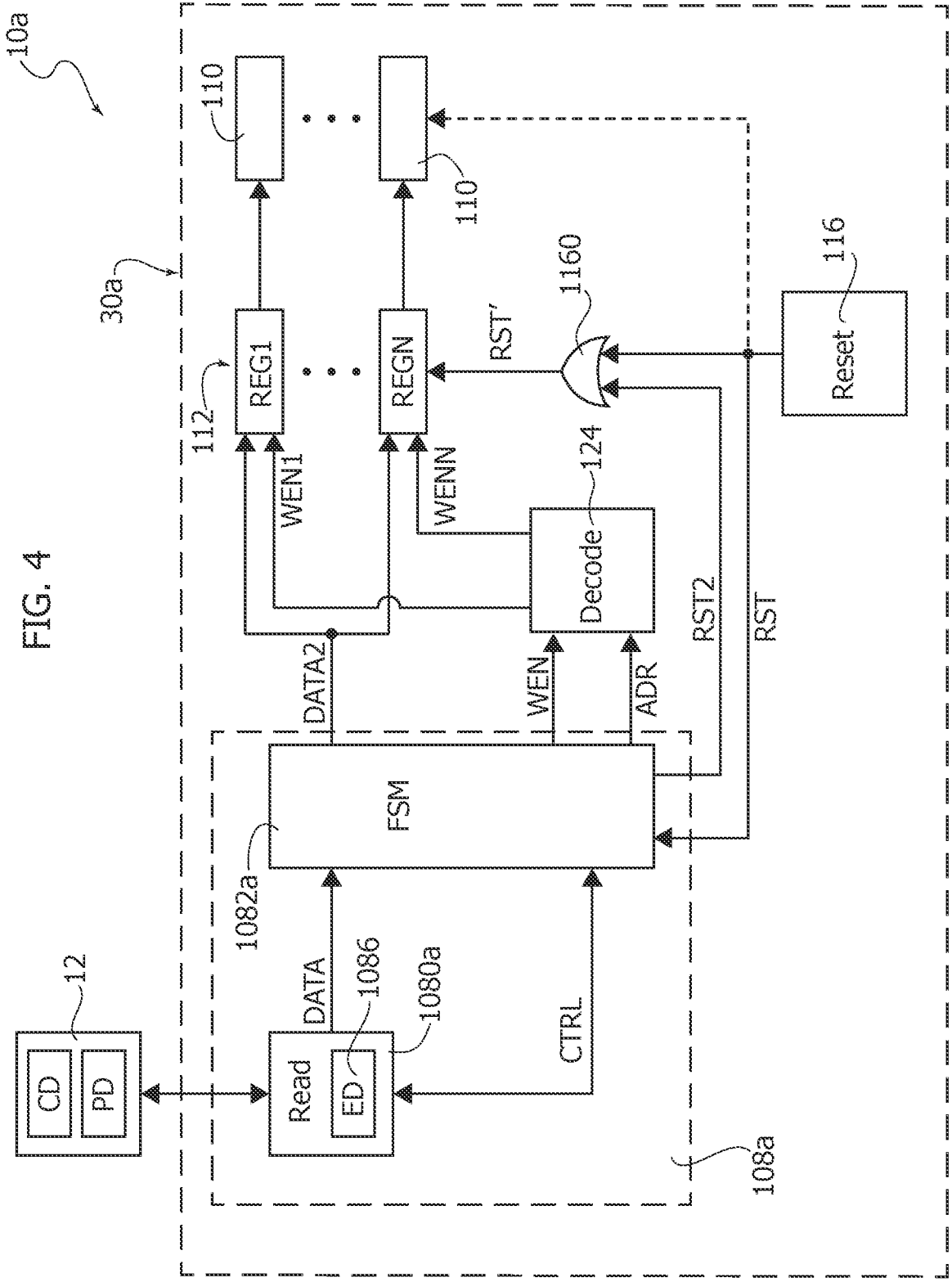
FIG. 4 shows an embodiment of a processing system comprising a hardware configuration circuit configured to read configuration data from a non-volatile memory a store the configuration data to registers.

FIG. 4 shows an embodiment of a processing system 10a according to the present disclosure. Specifically, the general architecture of the processing system 10a corresponds to the architecture described with respect to FIGS. 1 to 3, and the respective description applies in its entirety.

Specifically, also in this case, an integrated circuit 30a of the processing system 10a comprises a reset circuit 116 configured to generate a reset signal RST in response to a power-on of the processing system 10a, and a plurality of registers 112, for example N registers REG1, . . . , REGN, wherein each register 112 is configured to reset its content to a respective reset value in response to the reset signal RST. Accordingly, one or more circuits 110 of the processing system 10a, such as peripherals/resources 106 and/or a microprocessor 102 and/or a memory controller 100, may be configured to change operation as a function of configuration data stored to the registers 112. Generally, as schematically shown in FIG. 4, the reset signal RST may also be used to reset the registers 112 and/or one or more of the circuits 110.

Accordingly, also in this case, a hardware configuration circuit 108a is configured to read, in response to the reset signal RST, configuration data CD from a non-volatile memory 12a and store the configuration data CD read from the non-volatile memory 12a to the registers 112, thereby overwriting the reset values. As mentioned before, in order to store the configuration data read from the non-volatile memory 12a to the registers 112, the hardware configuration circuit 108a may generate an address signal ADR and an optional write enable signal WEN, and the processing system 10a may comprise an address decoder 124. Generally, the address decoder 124 may also be integrated in the hardware configuration circuit 108a. Moreover, the non-volatile memory 12a may be external or internal with respect to the integrated circuit 30a.

Figure 2:
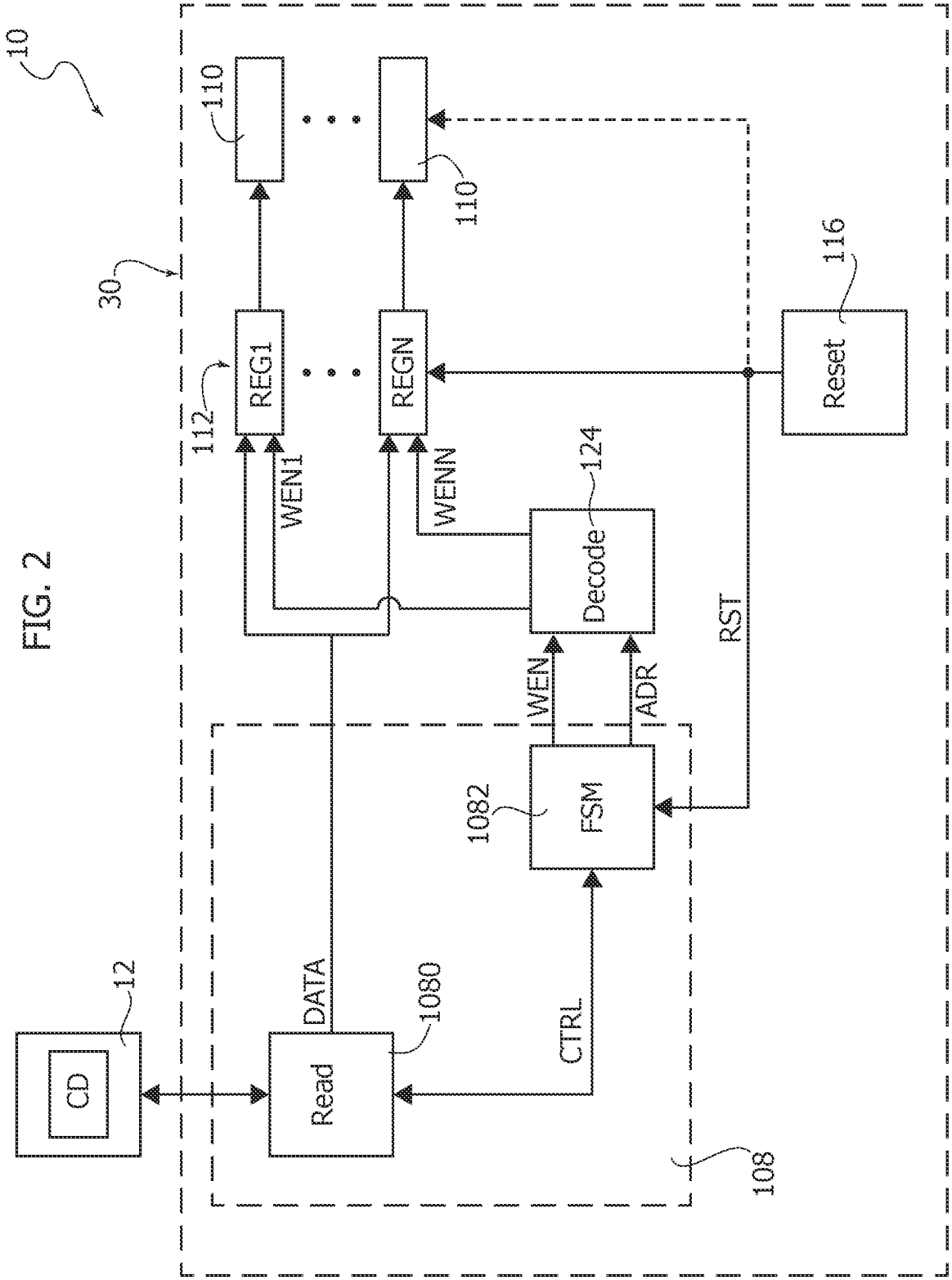
FIG. 2 shows a second example of a processing system configured to read configuration data from a non-volatile memory.

Compared to FIGS. 1 and 2, the non-volatile memory 12a stores not only the configuration data CD for the registers 112, but also additional error detection data PD, such as one or more parity bits.

Figure 5:
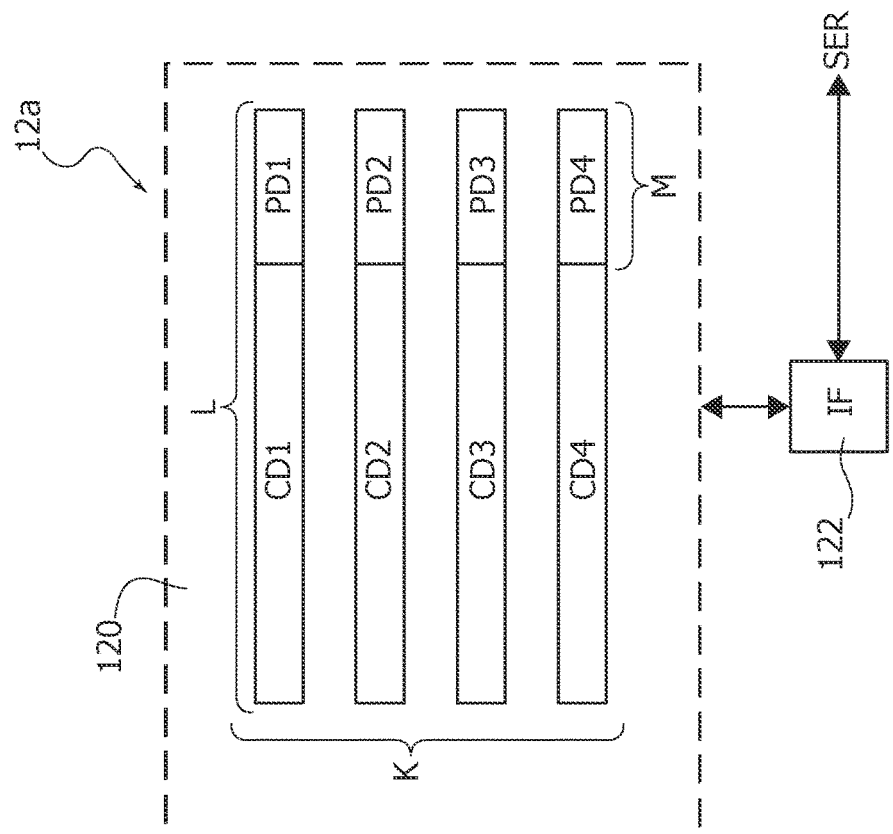
FIG. 5 shows an embodiment of the non-volatile memory of FIG. 4, wherein the non-volatile memory stores configuration data and error detection data.

For example, FIG. 5 shows an embodiment of the non-volatile memory 12a comprising a memory area 120 and a memory interface circuit 122.

For example, the memory area 120 may be organized in a given number K of memory slots, wherein each memory slot has a given number L of bits, also indicated as memory word size or page size in the following. For example, the memory 12a may have a memory word size of 32, 64 or 128 bits. For example, in various embodiments, the memory area 120 has K=4 memory slots with L=128 bits.

In the embodiment considered, the memory interface (IF) circuit 122 is thus configured to read the L bits of one memory slot and provide the read data having L bits via a communication channel SER to the processing system 10a, in particular the data read circuit 1080a. Specifically, in various embodiments, the communication channel SER is a serial communication channel, wherein the memory interface circuit 122 sequentially transmits the L bits of a given slot. Accordingly, the memory interface circuit 122 may comprise a serial interface, such as: an asynchronous serial interface, such as UART, wherein the memory interface circuit 122 generates a serial transmission signal in response to an internal clock signal; or preferably a synchronous serial interface, such as I2C or SPI interface, wherein the memory interface circuit 122 generates a serial transmission signal in response to a clock signal provided via a dedicated clock line.

Generally, such serial non-volatile memories are well-known in the art. For example, in this context may be cited the serial EEPROMs of the series M950x0, such as M95010, M95020 or M95040, produced by STMicroelectronics for example, which have a SPI or I²C communication interface.

As shown in FIG. 5, in various embodiments, each memory slot stores a given number M of bits of error detection data PD, such as error detection data PD1, PD4 for K=4 memory slots, and the remaining (L−M) bits of the slot are used to store configuration data, such as configuration data CD1, . . . , CD4 for K=4 memory slots.

Generally, the error detection data PD of a given slot may be calculated according to any suitable error detection code scheme and may, for example, include one or more parity bits. For example, in various embodiments, the number L of bits of a memory slot is divided into M sub-string, wherein each sub-string has L/M bits (for example, 16 bits in case L=128 and M=8). In this case, each sub-string of L/M bits may comprise a single parity bit calculated for the other (L/M−1) bits of configuration data.

Generally, the L bits of error detection data PD may be interleaved with the (M−L) bits of configuration data of a given memory slot or, as shown in FIG. 5, the configuration data and the error detection data may be arranged in separate consecutive bit sequences.

Figure 6:
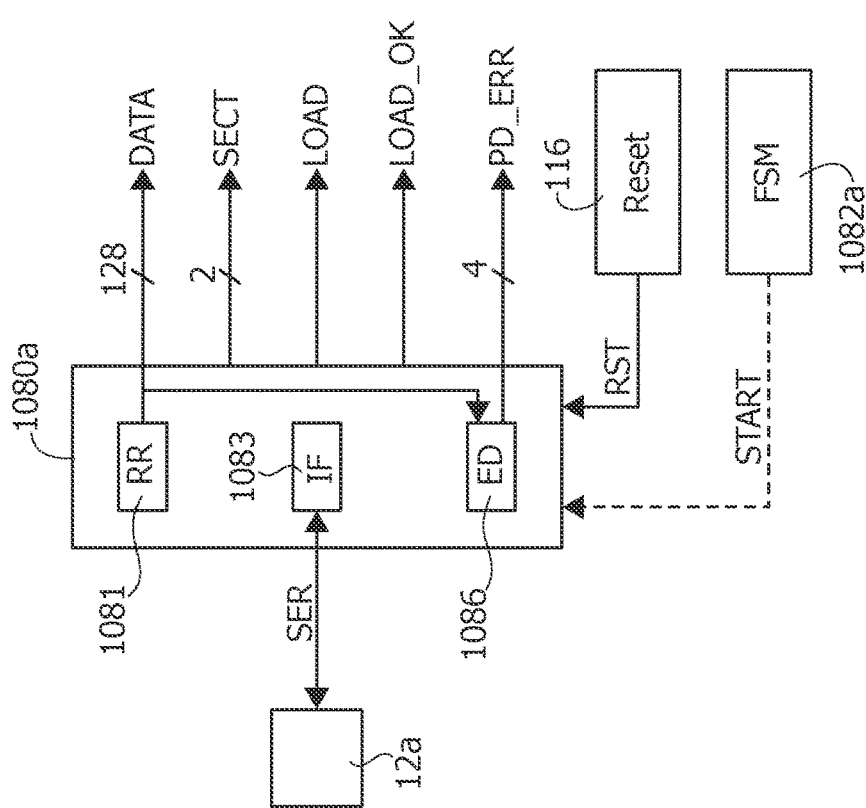
FIG. 6 shows an embodiment of a data read circuit of the hardware configuration circuit of FIG. 4.

FIG. 6 shows in this respect an embodiment of a data read circuit 1080a of the hardware configuration circuit 108a.

As mentioned before, the data read circuit 1080a of the hardware configuration circuit 108a may be configured to sequentially read the bits of each of the K memory slots. Generally, without loss of generality, based on the number of registers 112, the data read circuit 1080a could also just read a subset of the actual number of memory slots of the memory 12a. Accordingly, the number K should be construed as the number of memory slots actually transferred from the memory 12a to the registers 112.

Specifically, in various embodiments, the data read circuit 1080a comprises a reception register (RR) 1081 having L bits and a communication interface (IF) 1083 configured to receive the L bits of a given memory slot and store the received bits to the reception register 1081.

As mentioned before, indeed the memory interface circuit 122 may be configured to transmit the L bits of a given memory slot via a serial communication protocol. Accordingly, the communication interface 1083 may be a serial communication interface 1083, such as an UART, I$^2$C or SPI interface. In this respect any suitable communication protocol may be implemented in the memory interface circuit 122 and the communication interface 1083 for reading the data from the memory 12*a*. For example, the data read circuit 1080*a* may transmit via the (serial) communication channel SER: a command indicating the index of one of the K memory slots to be read, and the memory interface circuit 122 may provide in response, via one or more (physical link) transmission frames, the respective M bits of the requested memory slot; and/or a command requesting the transmission of all bits of the memory 12*a*, and the memory interface circuit 122 may provide in response, via one or more transmission frames, sequentially the bits of the K memory slots.

In various embodiments, the data read circuit 1080*a* may thus generate: a signal DATA providing the L bits (for example 128 bits) stored to the register 1081, such as the bits of the last memory slot read; a signal LOAD_OK indicating that a new memory slot has been read/stored to the register 1081; optionally a signal SECT indicating the number of the last read memory slot, for example having 2 bits for indicating the index of K=4 memory slots; and optionally a signal LOAD indicating that not all memory slots have been read yet.

As mentioned before, the hardware configuration circuit 108*a* is configured to read the data from the memory 12*a* in response to the reset signal RST. Accordingly, the data read circuit 1080*a* may be configured to start the reading operation directly in response to the reset signal RST or indirectly in response to a start signal START generated in turn by the control circuit 1082*a* in response to the reset signal RST.

As shown in FIG. 6, in various embodiments, the data read circuit 1080*a* comprises an error detection (ED) circuit 1086. Specifically, this error detection circuit 1086 is configured to calculate further M error detection bits according to the used error detection scheme based on the (L-M) bits of configuration data CD stored to the register 1081, i.e., of the last memory slot received from the non-volatile memory 12*a*. Moreover, the error detection circuit 1086 compares the further M error detection bits with the M error detection bits stored to the register 1081. In response to determining that the further M error detection bits correspond to the M error detection bits stored to the register 1081, the error detection circuit 1086 will de-assert an error signal PD_ERR. Furthermore, in response to determining that the further M error detection bits does not correspond to the M error detection bits stored to the register 1081, the error detection circuit 1086 will assert the error signal PD_ERR.

For example, in various embodiments, the error detection circuit 1086 is configured to generate a single error signal PD_ERR indicating whether the current data stored to the register 1081 (and provided via the signal DATA) comprise an error. However, in particular, in case the data read circuit 1080*a* generates also the signal SECT, the error detection circuit 1086 may be configured to generate an error signal PD_ERR having a plurality of bits in order to indicate the error status for each of the K memory slots, such as an error signal PD_ERR having K bits, wherein a respective bit is associated with each of the K memory slots. For example, this is schematically shown in FIG. 6, where the error signal PD_ERR has 4 bits for the exemplary case of K=4 memory slots.

Figure 7:
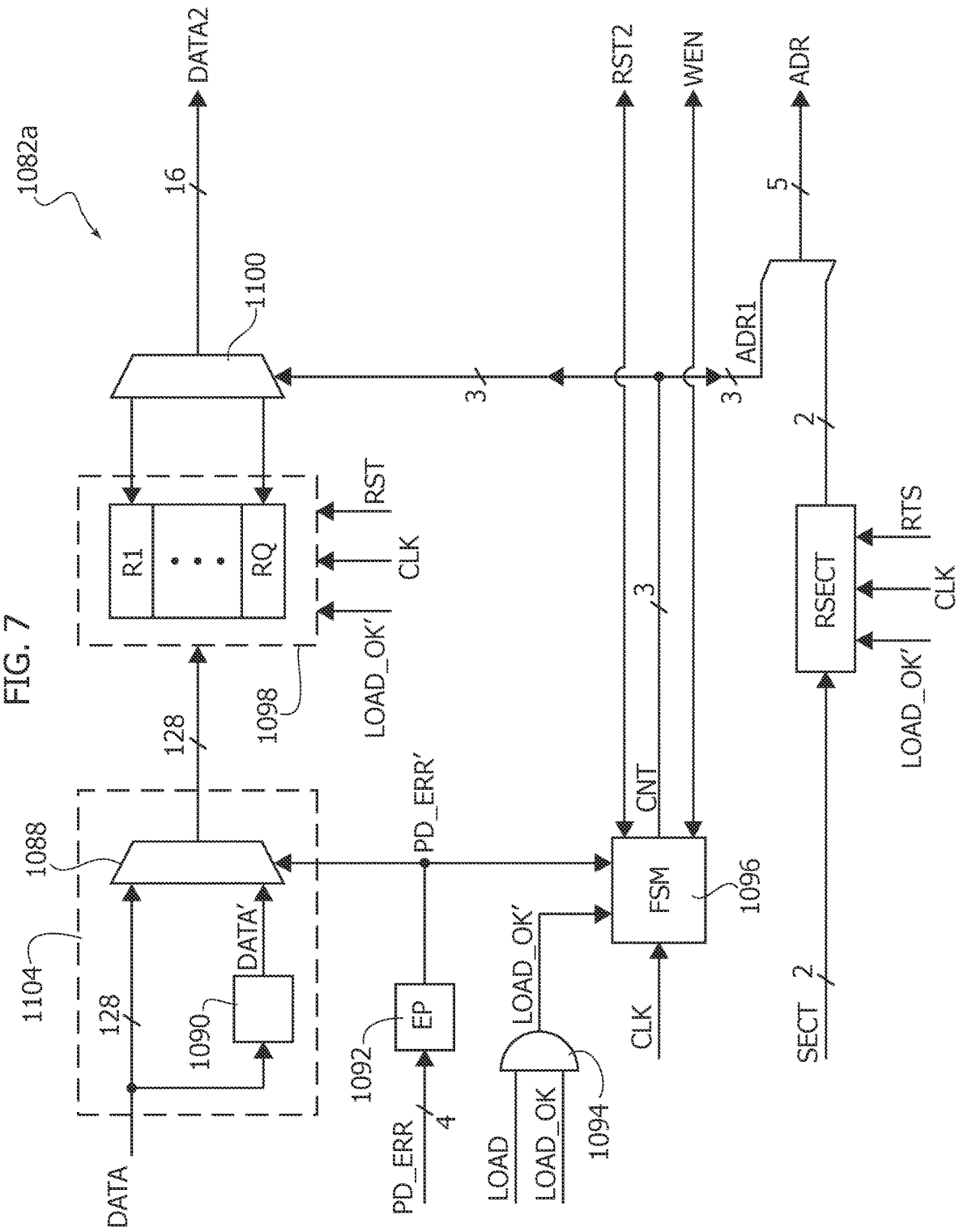
FIG. 7 shows an embodiment of a control circuit of the hardware configuration circuit of FIG. 4.

Accordingly, as shown in FIG. 7, in various embodiments, the control circuit 1082*a* of the hardware configuration circuit 108*a* is configured to receive the above signal DATA and the additional control signals LOAD_OK and PD_ERR, and optionally the signals LOAD and/or SECT.

Based on these signals, the control circuit 1082*a* generates the signals in order to forward the bits of the signal DATA to the respective registers 112. Specifically, as mentioned before, in various embodiments, each memory slot has a memory word size of L bits. In various embodiments, the registers have a number of P bits, indicated in the following also as register word size, corresponding to a fraction of L, wherein the number L of bits of a memory slot is a multiple of the P bits of a register 112 used to store configuration data within the processing system 10*a*. For example, in various embodiments, the registers 112 have 16 or 32 bits, for example P=16 and L=128.

Accordingly, in various embodiments, the control circuit cannot directly forward the L bits received via the signal DATA to a single register 112, but the control circuit 1082*a* has to generate Q=L/P write requests in order to store the L bits to Q registers 112, each having P bits. Accordingly, the number N of registers 112 corresponds also to K×Q. For example, for the exemplary case of P=16 and L=128, the control circuit 1082*a* would be configured to generate Q=8 write requests in order to store the L bits of the signal DATA to Q=8 respective registers 112. For example, for this purpose, the control circuit 1082*a* may comprise a state machine 1096, for example implemented with a sequential logic circuit, configured to detect whether the signal LOAD_OK (and optionally the signal LOAD) indicate that the signal DATA comprises new data. For example, in case the signal LOAD_OK and the signal LOAD are used, the control circuit 1094 may comprise a logic gate 1094, such as a AND gate, configured to: assert a signal LOAD_OK' when the signal LOAD is asserted and the signal LOAD_OK is asserted; and de-assert the signal LOAD_OK' when the signal LOAD is de-asserted or the signal LOAD_OK is de-asserted.

Accordingly, in response to detecting that the signal LOAD_OK (or LOAD_OK') is asserted, the state machine 1096 may increase a counter value CNT sequentially by one, such as in response to a clock signal CLK, for Q clock cycles. In case the signal SECT is omitted, the address signal ADR may thus correspond to the count value CNT. Conversely, as shown in FIG. 7, when using the signal SECT, the count value may only provide a subset of bits ADR1 of the address signal ADR and the remaining bits of the address signal ADR may correspond to the signal SECT. For example, the signal SECT may correspond to the Least Significant Bits (LSB) or the Most Significant Bits (MSB) of the address signal ADR. For example, in the exemplary embodiment, the address signal ADR has 5 bits, wherein 2 bits are provided by the signal SECT and 3 bits ADR1 are provided by the counter of the state machine 1096, which thus cyclically counts from 0 to (Q−1).

As shown in FIG. 7, in various embodiments the state machine 1096 may also generate the (optional) write enable signal WEN. For example, in response to the signal LOAD_OK (or LOAD_OK') the signal WEN may be asserted for Q clock cycles, wherein for each of the Q clock cycles the signal ADR1 (or directly the signal ADR) is increase by one, thereby indicating the address of a different register 112.

In various embodiments, the control circuit 1082*a* may also comprise a register or latch RSECT configured to store the signal SECT, for example in response to the signal LOAD_OK (or LOAD_OK'). For example, in the embodiment considered, the register RSECT is configured to: reset the value of the register RSECT to a reset value in response to the reset signal RST, and store the value of the signal SECT in response to the clock signal CLK and when the signal LOAD_OK (or LOAD_OK') is asserted.

Accordingly, in various embodiments, the control circuit 1082*a* is also configured to generate a signal DATA2 having P bits, wherein this signal DATA2 is used to provide the bits to be written to a given register 112 selected via the address signal ADR (see also FIG. 4). For example, in various embodiments, the bits of the signal DATA are selectively stored to (temporary) registers 1098 of the control circuit 1082*a*, in particular Q registers R1, . . . , RQ, each having P bits. Accordingly, a subset of P bits of the signal DATA may be stored to each of the registers R1, . . . , RQ. Accordingly, in this case, the data signal DATA2 may provide the P bits of one of the registers R1, . . . , RQ. For example, in the embodiment considered, the control circuit 1082*a* comprises for this purpose a multiplexer 1100 configured to generate the signal DATA2 by selecting the content of one of the registers R1, . . . , RQ as a function of the count value CNT, for example the bits corresponding to the bits ADR1.

As shown in FIG. 7, in various embodiments, the signal DATA is not provided directly to the registers 1098, but is processed via a selection circuit 1104. Specifically, in various embodiments, the selection circuit 1104 is configured to determine whether the data read circuit 1080*a* has signaled an error via the signal PD_ERR, and: provide the signal DATA to the registers 1098 in response to determining that the signal PD_ERR does not signal an error; or provide a signal DATA' comprising predetermined configuration data to the registers 1098 in response to determining that the signal PD_ERR signals an error.

Accordingly, in various embodiments, the registers 1098 may be configured to: reset the value of the registers R1, . . . , RQ to a reset value in response to the reset signal RST, and store the value of the signal provided by the selection circuit 1104 in response to the clock signal CLK and when the signal LOAD_OK (or LOAD_OK') is asserted.

In this respect, as shown in FIG. 7, in case the signal PD_ERR comprises a plurality of bits, the selection circuit 1104 may have associated an error processing (EP) circuit 1092 configured to assert a single error signal PD_ERR' when the error signal PD_ERR signals any error, for example when at least one of the bits of the signal PD_ERR is asserted.

Figure 8:
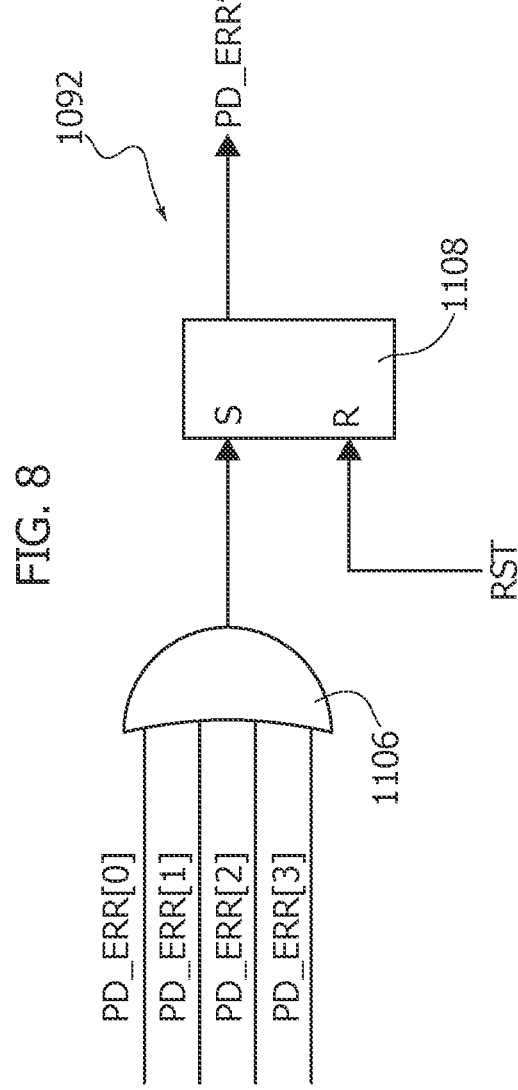
FIGS. 8 and 9 show embodiments of various sub-circuits of the control circuit of FIG. 7.

For example, this is shown in FIG. 8, where the error processing circuit 1092 comprises a logic OR gate 1106 receiving at input the bits of the error signal PD_ERR. Accordingly, the error signal PD_ERR' may correspond to the signal at the output of the OR gate 1106, or the signal PD_ERR' may be generated via a latch or flip-flop 1108 receiving at input the signal at the output of the OR gate 1106. For example, in the embodiment considered, the error processing circuit 1092 comprises a set-reset latch (or flip flop) receiving at the set input the signal at the output of the OR gate 1106 and at the reset input the reset signal RST.

As mentioned before, the selection circuit 1104 is configured to provide bits DATA' comprising predetermined configuration data when an error in the configuration data is signaled via the signal PD_ERR. For example, as shown in FIG. 7, in various embodiments, the selection circuit 1104 comprises a circuit 1090 configured to provide the bits DATA', and a multiplexer 1088 configured to provide either the signal DATA or the signal DATA' as a function of the signal PD_ERR'.

Figure 9:
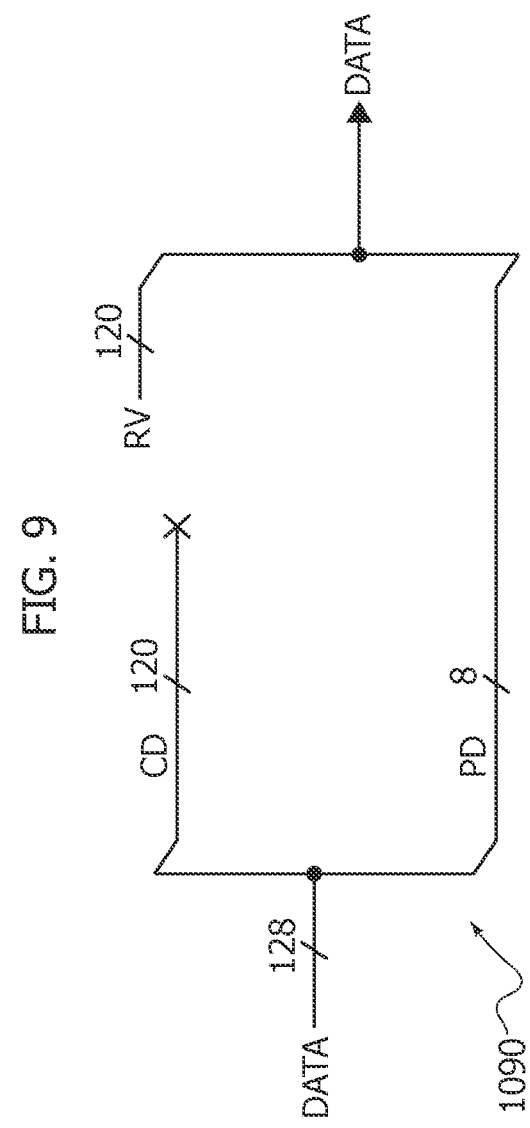

In this respect, in various embodiments, the signal DATA' provides predetermined configuration data. For example, FIG. 9 shows an embodiment of the circuit 1090. Specifically, in the embodiment considered, the selection circuit 1104, in particular the circuit 1090, is configured to generate the signal DATA' by: maintaining the L bits of error detection bits PD of the signal DATA; and overwriting the other (M-L) bits of configuration data with a reset value RV.

For example, in the simplest case, the reset value RV may be fixed for all of the K memory locations, and may correspond, for example, to a bit sequence having all bits set to low. However, the circuit 1090 could also be configured to determine the bits of the reset value RV as a function of the memory slot, for example as a function of the signal SECT indicating the last memory slot read.

Accordingly, in various embodiments, in case the data read circuit detects an error in the bits read from a given memory slot, the control circuit 1082*a* stores modified bits DATA' to the registers 1098, and accordingly the modified bits DATA' are transmitted via the signal DATA2 and the address signal ADR to the respective registers 112.

In various embodiments, for example by using the combined error signal PD_ERR', the modified bits DATA' will thus also be used for the following memory slots, even though these memory slots may not comprise errors. However, this does not take into account that one or more memory slots may also have been transferred to the registers 112.

Accordingly, in various embodiments, the state machine 1096 may also generate a further reset signal RST2 once the K memory slots have been read and processed. For example, as shown in FIG. 4, in various embodiments, this further reset signal RST2 may be used to reset the registers 112. For example, in FIG. 4 is shown a logic OR gate 1160, which asserts a combined reset signal RST' when one of the reset signal RST or RST2 is asserted. Accordingly, in this case, the registers 112 may be reset in response to the reset signal RST', thereby bringing the registers 112 to their reset value, once the configuration data CD have been read from the memory 12*a* and an error is detected in any of the memory slots.

Figure 10:
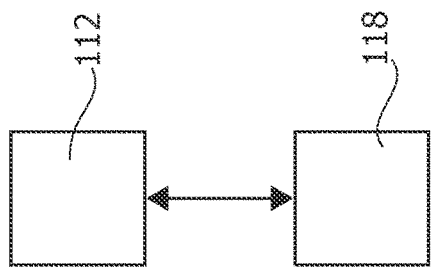
FIG. 10 shows an embodiment of a processing system adapted to read the configuration data stored to the registers of the processing system of FIG. 4.

However, as shown in FIG. 9, in various embodiments, indeed the modified signal DATA' comprises the original error detection bits PD provided via the signal DATA, which should correspond to the error detection bits of the respective memory slot. Accordingly, in this way, the error detection bits PD are transferred always to the registers 112, even though an error is detected in the bit sequence. In fact, as shown in FIG. 10, the processing systems 10*a* may comprise a communication interface 118, such as a debug interface, which permits to read the data stored to the registers 112, for example for debug purposes. However, by generating the further reset signal RST2, the content of the registers 112 would be reset, thereby also overwriting the error detection bits PD stored to the registers 112.

Figure 11:
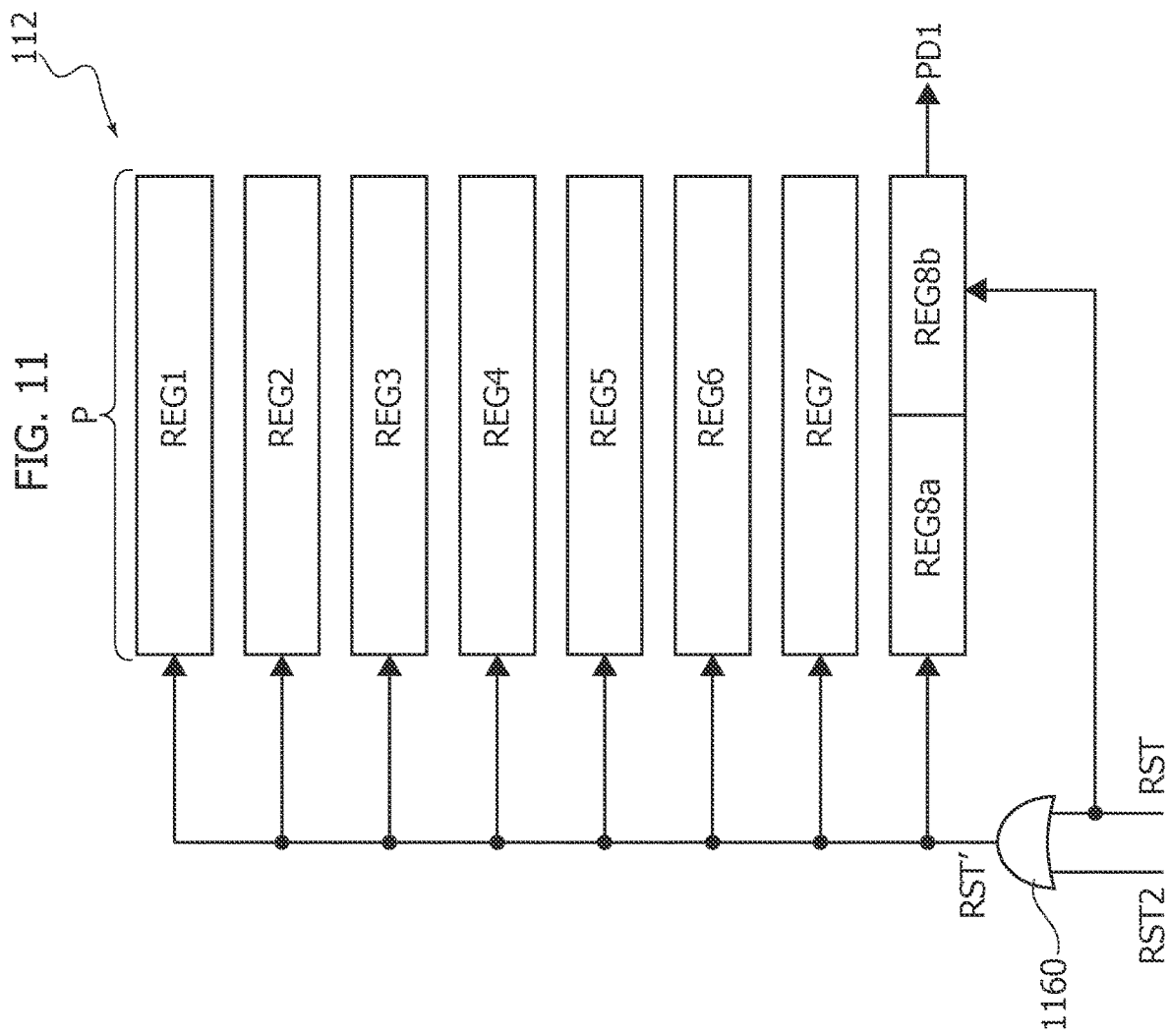
FIGS. 11 and 12 show further embodiments of the registers of the processing system of FIG. 4.

FIG. 11 shows in this respect a different embodiment of the registers 112*a*.

Specifically, as mentioned before, the control circuit 1082*a* is configured to store the L bits of the signal DATA (or DATA') via the signal DATA2 to respective Q registers 112, each having P bits. For example, in FIG. 11 are shown 8 registers REG1, REG8, each having 16 bits for example, which may be used to store the L bits of the first memory slot.

Accordingly, the error detection bits PD will be stored to predetermined positions within the registers 112. For example, when using the exemplary position of the error detection bits PD within a given memory slot, the respective error detection bits would be transferred to a given subset of bits of the last register, for example register REG8. For example, the configuration data CD1 would be stored to the registers REG1, REG7 and a first subset REG8a of 8 bits of the register REG8, and the error detection bits PD would be stored to a second subset REG8b of 8 bits of the register REG8.

Accordingly, in various embodiments, in order to permit a reading of the error detection bits, for example the bits PD1, the register bits of the registers 112 arranged to store bits of configuration data CD are configured to reset their contents in response to both the reset signal RST and the reset signal RST', or for example in response to the signal RST'. Conversely, the register bits of the registers 112 arranged to store bits of error detection data PD are configured to reset their contents in response to the reset signal RST, but not in response to the reset signal RST'. Accordingly, in this way, the content of the register bits of the registers 112 having stored error detection bits PD is maintained and the communication interface 118 may be used to read the error detection bits, even when the reset signal RST2 resets the other register bits in response to an error in the data stored to the memory 12a.

Figure 12:
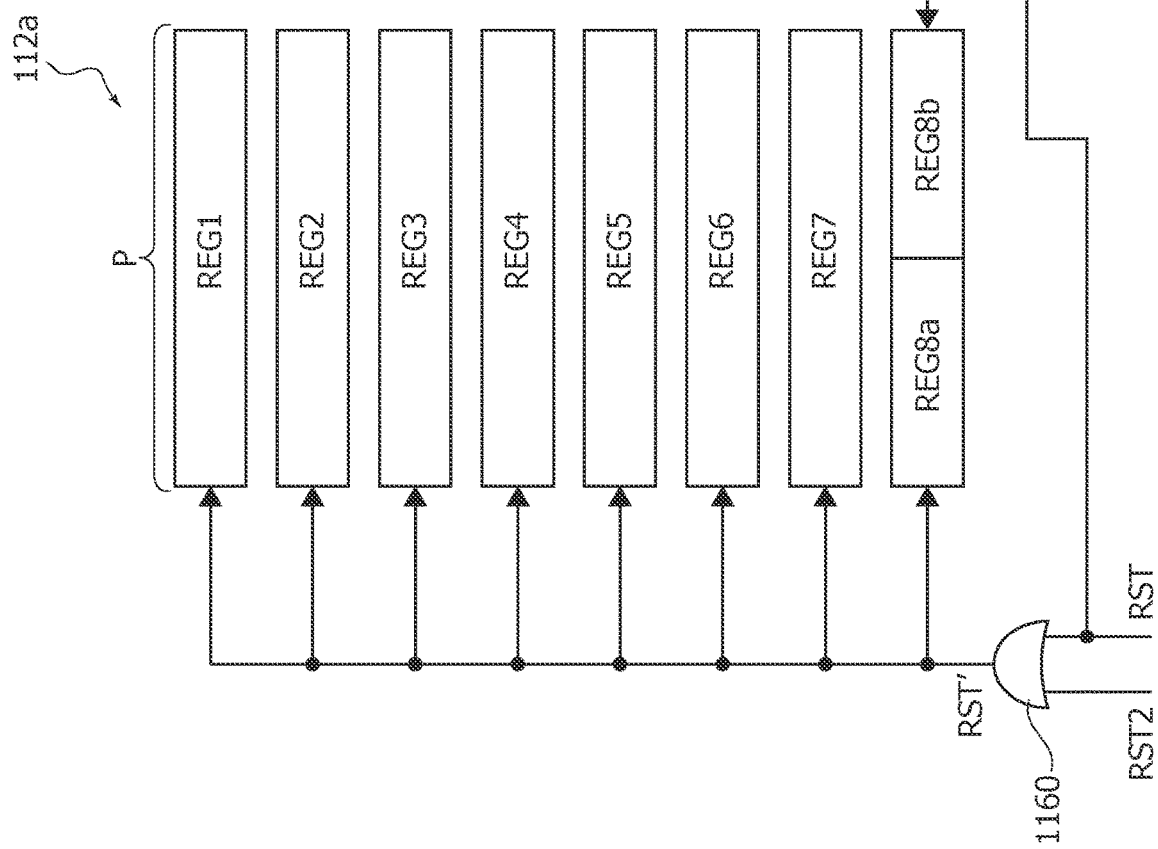

FIG. 12 shows a further embodiment of the registers 112a.

Specifically, in the embodiment considered, the data read circuit 1082a comprises additional K registers 1110, each having M bits, for storing the error detection bits PD (for example the bits PD1, PD2, PD3 and PD4). For example, in the embodiment considered, the circuit 1082a is configured to store the bit sequence PD of the signal DATA (see also FIG. 9) to a respective register 1110, for example by using the signal provided by the register RSECT as address signal used to select one of the K additional registers. For example, in the embodiment considered, a demultiplexer 1112 is used to assert a write enable signal of one of the registers 1110 by selectively forwarding the signal WEN as a function of the signal RESCT, whereby one of the registers 1110 is selected as a function of the signal RSECT and stores the bit sequency PD when the signal WEN is asserted. Generally, the signals RSECT and WEN may also be replaced with the signals SECT and LOAD_OK (or LOAD_OK'). Accordingly, in the embodiment considered, the registers 1110 are configured to be reset in response to the reset signal RST, and maintain their content when the reset signal RST2 is asserted.

In the embodiment considered, the bits of the registers 112a used to provide the error detection bits PD are implemented with (for example, read-only) shadow registers. In this case, the bits of the registers 112a used to provide the error detection bits PD, for example the register REG8b, are implemented with a register (having M bits), which may be read via the read requests sent to the registers 112a, and the content is automatically updated based on the content of a respective register 1110, for example the content of the register 1110 used to store the bits PD1 is automatically stored to the register REG8b. Accordingly, in this case, even when performing a reset in response to the signal RST' of the shadow registers used to provide the error detection bits PD, for example REG8b, the content of these registers is automatically update again at the next clock cycle by transferring the content of the registers 1110 to the respective registers 112a.

Alternatively, the bits of the registers 112a used to provide the error detection bits PD, for example the register REG8b, may also be omitted and the respective bits may be connected directly to the respective bits of the registers 1110. Accordingly, in this case, the content of the registers 1110 may be read by sending read requests to the registers 112a, for example a read request sent to the register REG8, wherein the first bits are read from the register REG8a and the second bits (REG8b) are read directly from the register 1110 used to store the bit sequence PD1.

Figure 13:
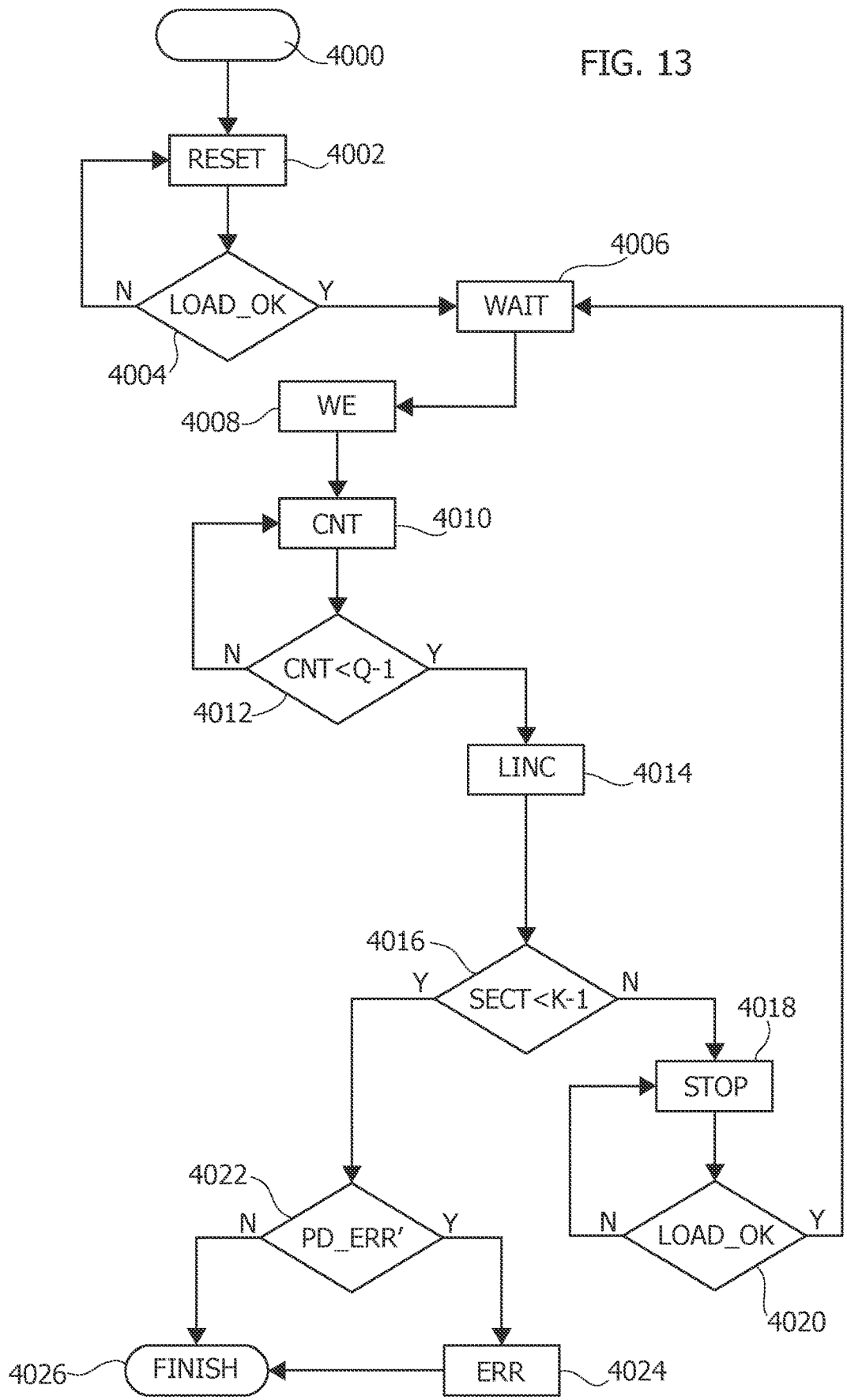
FIGS. 13 and 14 show embodiments of the operation of the control circuit of FIG. 7.

An embodiment of the operation of the control circuit 1082a, in particular the state machine 1096, is also shown in FIG. 13.

Specifically, once the state machine 1096 is activated at a start step 4000, for example after a power-on of the processing system 10a, the state machine 1096 activates at a step 4002 a state RESET. Specifically, in the embodiment considered, the state machine 1096 remains in the state RESET until the data of the first memory slot are received. As mentioned before, the reception of the data may be signaled via the signal LOAD_OK (or LOAD_OK' generated by the logic gate 1094). For example, this is schematically shown via a step 4004 where the state machine 1096 verifies whether the signal LOAD_OK (or LOAD_OK') is asserted. In case the signal LOAD_OK (or LOAD_OK') is de-asserted (output "N" of the verification step 4004), the state machine 1096 returns to the step 4002.

Conversely, in case the signal LOAD_OK (or LOAD_OK') is asserted (output "Y" of the verification step 4004), the state machine 1096 proceeds to a step 4006, where the state machine activates a state WAIT, where the state machine 1096 waits for a single clock cycle. Generally, the wait state WAIT is purely optional, and is useful in case the signal DATA (or DATA') and/or PD_ERR (or PD_ERR') and/or the signal SECT are stored to registers 1098 and/or 1108 and/or RSECT, respectively. In fact, these registers may store the respective signal directly in response to the signal LOAD_OK (or LOAD_OK'), such as in parallel to the operation of the state machine 1096.

Accordingly, in the embodiment considered, the state machine 1096 does not leave the state RESET directly in response to the reset signal RST, but in response to the signal LOAD_OK (or LOAD_OK'). However, this does not change the operation, because—as described with respect to FIG. 6—the data read circuit 1080a may already start the reading of the data from the memory 12a in response to detecting that the reset signal RST is de-asserted.

Figure 14:
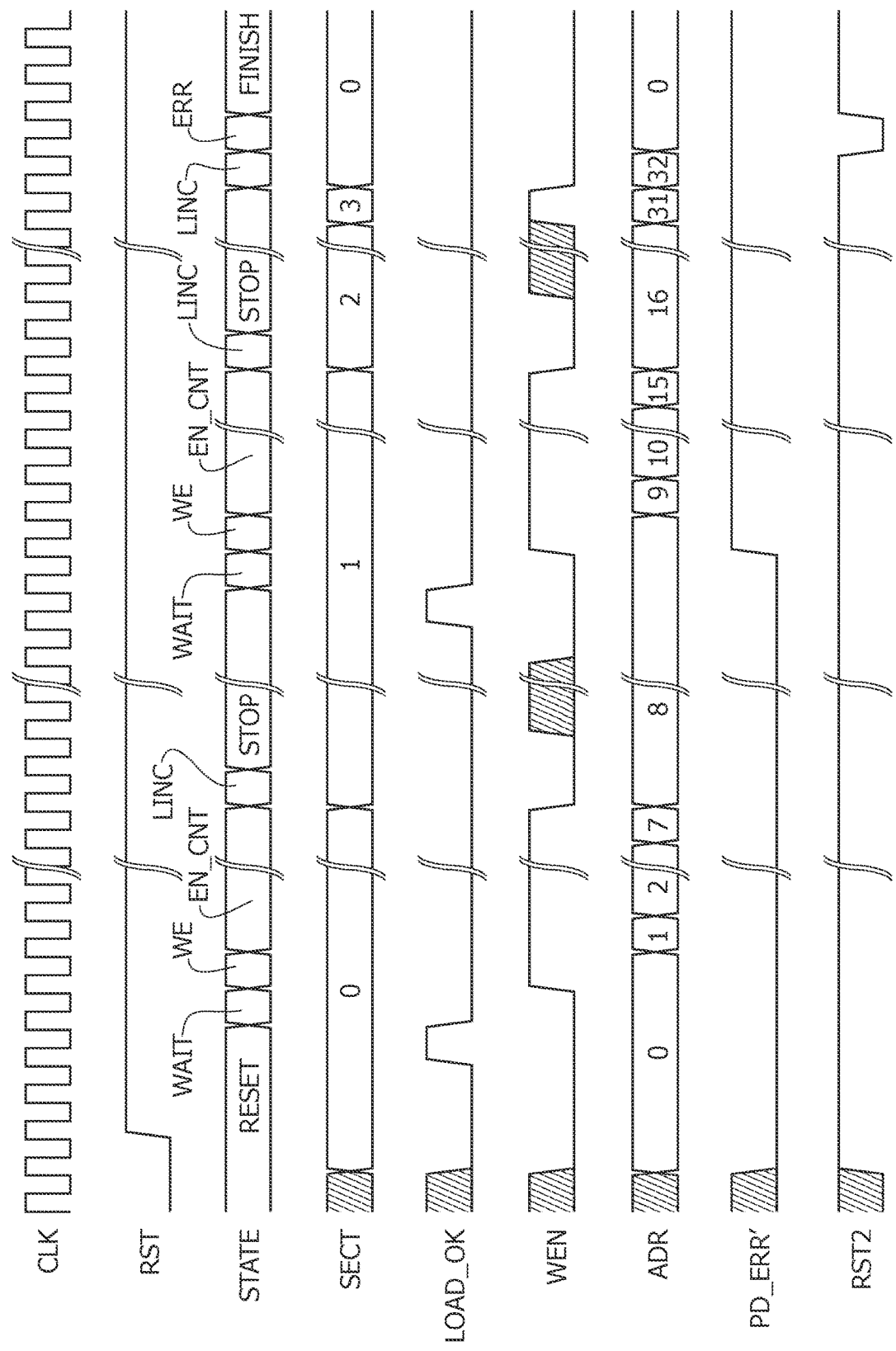

This is also shown in FIG. 14, which shows exemplary waveforms for the major signals also shown in FIG. 7. Specifically, once the reset signal RST is de-asserted, for example once the signal RST is high, the data read circuit 1080a reads L bits form the first memory slot, and then applies the received bits to the signal DATA, verifies the content of the bits and eventually asserts the error signal PD_ERR. Moreover, the data read circuit 1080a asserts the signal LOAD_OK, whereby the state STATE of the state machine 1096 advances from the state RESET to the state WAIT.

In the embodiment considered, the state machine 1096 proceeds then to step 4008, where the state machine activates a state WE, where the state machine 1096 asserts the write enable signal WEN and waits for a single clock cycle. This is also shown in FIG. 14. Specifically, when the signal WEN is asserted for the first time the signal ADR is set to "0", for example because the count value CNT generated by the state machine 1096 is set to "0" and the signal SECT provided by the data read circuit 1080a is set to "0". This implies that the content of the register R1 is stored to the register 112 associated with the address "0", for example the register REG1 shown in FIG. 11.

In the embodiment considered, the state machine 1096 proceeds then to step 4010, where the state machine activates a state CNT, where the state machine 1096 maintains asserted the write enable signal WEN, but increases the count value CNT by one. Accordingly, the count value CNT, and accordingly the address ADR is increased by one, whereby the content of the register R2 is stored to the register 112 associated with the address "1", for example the register REG2 shown in FIG. 11.

Accordingly, the state machine 1096 may remain in the state CNT until the value CNT has reached the value (Q−1). For example, this is schematically shown via a verification step 4012, where the state machine 1096 verifies whether the count value CNT is smaller than (Q−1). Accordingly, in case the count value CNT is smaller than (Q−1), the state machine 1096 may return to the step 4008/remain in the state CNT, thereby sequentially increasing the count value CNT and accordingly the address ADR, thereby writing the data stored to the registers 1098 to respective registers 112 indicated by the address signal ADR.

Conversely, when the count value CNT corresponds to or is greater than (Q−1), the state machine 1096 proceeds to a step 4014, where the state machine activates a state LINC, where the state machine de-asserts the write enable signal WEN and waits for a single clock cycle.

The state machine 1096 verifies then at a step 4016 whether the data of other memory slots should be processed, for example by verifying whether the signal SECT is smaller than the number (K−1). For example, when further memory slots should be processed (output "Y" of the verification step 4016), for example when the signal SECT is smaller than the number (K−1), the state machine 1096 proceeds to a step 4018, where the state machine activates a stop state STOP. Specifically, in the embodiment considered, the state machine remains in the stop state until the data read circuit 1080a signals via the signal LOAD_OK that the bits of a new memory slot have been read. For example, for this purpose, the state machine may verify at a step 4020 whether the signal LOAD_OK (or LOAD_OK') is asserted and return to the step 4018 when the signal is not asserted and to the step 4006 when the signal is asserted. Those of skill in the art will appreciate that FIG. 13 does not specifically show a reset of the count value CNT. In fact, in the embodiment considered, when counting with a 3-bit counter for 8 cycles, the count value CNT will automatically be reset to the value "0". Otherwise, the count value CNT may also be reset explicitly, for example at the step 4006.

Accordingly, in the embodiment considered, the steps 4002-4020 are just used to manage the transfer of the bits of the signal DATA or DATA' (as provided by the selection circuit 1104) to the registers 112 by generating the address signal ADR (via the count value CNT) and the write enable signal WEN. In fact, the overwriting of the bits of the signal DATA is managed by the selection circuit 1104, and the selection of the current signal DATA2 is managed by the multiplexer 1100.

Once all bits of the K memory slots have been processed, the state machine 1096 may thus verify whether an error occurred. In the embodiment considered, the state machine 1096 may just use the signal PD_ERR' (generated by the error processing circuit 1092) already indicating whether any of the memory slots contained errors. For example, when the signal PD_ERR just signals that the current bits of the signal DATA comprise an error, the error processing circuit 1092 could be configured to generate the signal PD_ERR' by asserting the signal PD_ERR' (for example via the set-reset flip-flop or latch 1108) once the signal PD_ERR is asserted.

Accordingly, in the embodiment considered, when the last memory slot has been processed (output "N" of the verification step 4016), for example when the signal SECT corresponds to the number (K−1), the state machine 1096 proceeds to a verification step 4022, where the state machine verifies the logic level of the signal PD_ERR'. In case the signal PD_ERR' is de-asserted (output "N" of the verification step 4022), the state machine 1096 proceeds to a stop step 4026, where the state machine actives a state FINISH indicating that the operation has been completed. Conversely, in case the signal PD_ERR' is asserted (output "Y" of the verification step 4022), the state machine 1096 proceeds to a step 4024, where the state machine actives a state ERR, where the state machine 1096 asserts the signal RST2, and then proceeds to the step 4026.

This is also shown in FIG. 14, where the signal PD_ERR' is asserted for the data of the second memory slot (SECT="1"), but the state machine proceeds to the step ERR, thereby asserting the reset signal RST2, only once the data have been transferred to the last register 112, for example having associated the address "31".

In fact, as described in the foregoing, in various embodiments, the hardware configuration circuit still processes all K memory slots in order to transfer the error detection data to the registers 112, wherein the registers 112 are configured to maintain the error detection data even when the reset signal RST2 is asserted.

Accordingly, the hardware configuration circuit 108a described in the foregoing has several advantages. Generally, the solution permits to protect the processing system 10a from a download of erroneous configuration data. In this respect, by resetting the configuration data via the reset signal RST2 in case of an error, possible malfunctioning originated form mismatches between registers correctly written and blanked ones may be avoided. Moreover, in case of an error, the device may use a default (for example, safe) configuration RV to let the device work in normal state. However, the processing system 10a may be able to maintain the error detection bits PD in order to provide a user to possibility the find the error source by reading the respective bits of the registers 112.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, while the previous solutions use error detection data PD, these data may also include Error Correction Code (ECC) bits, for example determined according to a Single Error Correction and Double Error Detection (SECDED) code. For example, in this case, the error detection circuit 1086 may be replaced with an error detection and correction circuit, wherein the signal PD_ERR indicates whether the bits of the signal DATA contain an uncorrectable error.

The claims are an integral part of the technical teaching of the disclosure provided herein.

The invention claimed is:

1. A processing system, comprising:
a serial non-volatile memory comprising K number of memory slots, wherein each memory slot has L number of bits, wherein said L number of bits comprise a first number of configuration data bits and a second number of error detection bits calculated as a function of the respective first number of configuration data bits;
a reset circuit configured to generate a reset signal in response to a power-on of the processing system;
N number of configuration registers, wherein each configuration register of said N number of configuration registers is associated with a univocal address and has P number of bits, wherein each configuration register of said N number of configuration registers is reset to a respective reset value in response to said reset signal, wherein Q number of configuration registers are associated with each memory slot of said K number of memory slots, with Q=L/P and N=Q×K;
one or more circuits configured to change operation as a function of bit values stored to said N number of configuration registers;
a hardware configuration circuit comprising Q number of temporary registers, each temporary register of said Q number of temporary registers having P number of bits;
wherein said hardware configuration circuit is configured, in response to said reset signal, to sequentially read data from said serial non-volatile memory and store the read data to respective configuration registers of said N number of configuration registers by performing the following operations for each memory slot of the K number of memory slots of said serial non-volatile memory:
  determining an index of a current memory slot of said serial non-volatile memory and receiving the L number of bits of the current memory slot via a serial communication from said serial non-volatile memory;
  once having received the L number of bits of the current memory slot:
    calculating further error detection bits as a function of said configuration data bits and selectively asserting an error signal by comparing said error detection bits with said calculated further error detection bits;
    verifying whether said error signal is asserted and, in response to determining that said error signal is asserted, asserting a further error signal that indicates whether read data from any of the K number of memory slots comprise an error;
    verifying whether said further error signal is asserted, and:
      a) in response to determining that said further error signal is de-asserted, storing the received L number of bits to said Q number of temporary registers; and
      b) in response to determining that said further error signal is asserted, storing predetermined configuration data bits to said Q number of temporary registers;
    sequentially storing content of said Q number of temporary registers to respective Q number of configuration registers by providing the content of one temporary register of said Q number of temporary registers and generating via a counter an address signal having the univocal address associated with the respective configuration register of said Q number of configuration registers;
wherein said hardware configuration circuit is configured, once having received read data of said K number of memory slots, to verify whether said further error signal is asserted; and
in response to determining that said further error signal is asserted, generate a further reset signal for resetting, at least in part, said N number of configuration registers;
wherein K, L, P, N and Q are each positive whole numbers.

2. The processing system according to claim 1, wherein said hardware configuration circuit comprises a data-read circuit comprising:
a reception register having L number of bits;
a serial communication interface configured to receive said L number of bits of the current memory slot via the serial communication from said non-volatile memory, and assert a control signal in response to having received the L number of bits; and
an error detection circuit configured to calculate said further error detection bits and selectively assert said error signal.

3. The processing system according to claim 2, wherein said serial communication interface is configured to generate a signal indicating the index of the current memory slot of said serial non-volatile memory.

4. The processing system according to claim 3, wherein said serial communication interface is configured to receive said L number of bits of the current memory slot by sending a read request to said serial non-volatile memory, said read request comprising data identifying the index of the current memory slot of said serial non-volatile memory.

5. The processing system according to claim 2, wherein said hardware configuration circuit comprises a control circuit comprising a selection circuit configured to provide data comprising one of said L number of bits of the current memory slot or said predetermined configuration data bits to said Q number of temporary registers as a function of said further error signal, and wherein said Q number of temporary registers are configured to store the data provided by said selection circuit in response to said control signal.

6. The processing system according to claim 3, wherein said hardware configuration circuit comprises a sequential logic circuit implementing a state machine, wherein said state machine is configured to:
sequentially increase a count value for Q number of consecutive clock cycles in response to said control signal;
wherein said address signal corresponds to said count value.

7. The processing system according to claim 6, wherein said state machine is configured to:
determine whether all of said K number of memory slots have been transferred to said N number of configuration registers as a function of said count value and optionally said signal indicating the index of the current memory slot of said serial non-volatile memory; and
assert said further reset signal as a function of said further error signal in response to determining that all of said K memory slots have been transferred to said N number of configuration registers.

8. The processing system according to claim 3, wherein said hardware configuration circuit comprises a sequential logic circuit implementing a state machine, wherein said state machine is configured to:

sequentially increase a count value for Q number of consecutive clock cycles in response to said control signal;
wherein said address signal is determined by combining the bits of said count value and the bits of said signal indicating the index of the current memory slot.

9. The processing system according to claim 8, wherein said state machine is configured to:
determine whether all of said K number of memory slots have been transferred to said N number of configuration registers as a function of said count value and optionally said signal indicating the index of the current memory slot of said serial non-volatile memory, and
assert said further reset signal as a function of said further error signal in response to determining that all of said K number of memory slots have been transferred to said N number of configuration registers.

10. The processing system according to claim 1, wherein said hardware configuration circuit is configured, in response to determining that said further error signal is asserted, to store the error detection bits of the received L number of bits together with said predetermined configuration data bits to said Q number of temporary registers, wherein the error detection bits for said K number of memory slots are stored to predetermined bit positions of said N number of configuration registers, and wherein said N number of configuration registers are configured to:
reset the content of said N number of configuration registers in response to said reset signal; and
reset the content of said N number of configuration registers except for said predetermined bit positions in response to said further reset signal.

11. The processing system according to claim 1, wherein the hardware configuration circuit is configured to store the error detection bits of the received L number of bits to further registers, wherein said further registers are configured to be reset in response to said reset signal, and wherein said further registers are configured to maintain their content when said further reset signal is asserted, and wherein the error detection bits are stored in shadow registers connected to said further registers.

12. The processing system according to claim 1, further comprising a communication interface configured to transmit the content of one or more configuration registers of said N number of configuration registers to an external device.

13. The processing system according to claim 1, further comprising a circuit configured to store to each memory slot of said K number of memory slots of said serial non-volatile memory the respective first number of configuration data bits and respective second number of error detection bits.

14. The processing system according to claim 1, further comprising a circuit for switching on said processing system so that said hardware configuration circuit operates to sequentially read the data from said serial non-volatile memory and store the read data or the predetermined configuration data bits to the respective Q number of configuration registers.

15. The processing system according to claim 14, further comprising a circuit configured to read the content of said N number of configuration registers via said communication interface.

16. An integrated circuit comprising: a processing system according to claim 1.

17. A processing system, comprising:
a non-volatile memory comprising a plurality of memory slots, wherein each memory slot stores configuration data bits and error detection bits calculated as a function of the configuration data bits;
a plurality of configuration registers associated with each memory slot;
circuits whose operation is controlled as a function of data stored in said plurality of configuration registers;
a hardware configuration circuit comprising a plurality of temporary registers;
wherein said hardware configuration circuit is configured to:
receive the configuration data bits from a current memory slot of said plurality of memory slots;
calculate further error detection bits as a function of said configuration data bits;
compare said error detection bits with said calculated further error detection bits;
assert an error signal in response to the comparison to indicate that the configuration data bits contain an error;
store data in the configuration registers by:
a) in response to de-assertion of the error signal, storing the configuration data bits to said plurality of temporary registers;
b) in response to assertion of the error signal, storing predetermined configuration data bits to said plurality of temporary registers; and
c) transferring content from the plurality of temporary registers to the plurality of configuration registers.

18. The processing system according to claim 17, further comprising, in response to assertion of the error signal, resetting at least in part content of said plurality of configuration registers.

19. The processing system according to claim 17, further comprising, in response to a power-on of the processing system, resetting each configuration register of the plurality of configuration registers.

20. The processing system according to claim 17, wherein storing data in the plurality of configuration registers comprises sequentially storing content from said plurality of temporary registers to respective configuration registers of the plurality of configuration registers.

21. The processing system according to claim 17, wherein said hardware configuration circuit comprises a data-read circuit comprising:
a reception register;
a serial communication interface configured to receive data from the current memory slot via a serial communication from said non-volatile memory and assert a control signal in response thereto; and
an error detection circuit configured to calculate said further error detection bits and selectively assert said error signal.

22. The processing system according to claim 21, wherein said hardware configuration circuit further comprises a control circuit comprising a selection circuit configured to provide data comprising one of said configuration data bits or said predetermined configuration data bits to said temporary registers as a function of said error signal, and wherein said temporary registers are configured to store data provided by said selection circuit in response to said control signal.

23. An integrated circuit comprising: a processing system according to claim 17.

* * * * *